US006144237A

United States Patent [19]

Ikezaki

[11] Patent Number: 6,144,237

[45] Date of Patent: Nov. 7, 2000

[54] POWER ON RESET CIRCUIT

[75] Inventor: Masahiro Ikezaki, Oita-ken, Japan

[73] Assignee: Kabushiki Kaisha Toshiba, Kawasaki, Japan

[21] Appl. No.: 09/052,364

[22] Filed: Mar. 31, 1998

[30] Foreign Application Priority Data

Mar. 31, 1997 [JP] Japan .................................... 9-080491

[51] Int. Cl.[7] ...................................................... H03K 17/22

[52] U.S. Cl. ............................................ 327/143; 327/198

[58] Field of Search .................................... 327/141, 142, 327/143, 146, 155, 198

[56] References Cited

U.S. PATENT DOCUMENTS 5,786,716 7/1998 Honda et al. ........................... 327/143
5,825,220 10/1998 Kinugasa et al. ....................... 327/143
5,847,586 12/1998 Burstein et al. ........................ 327/143
5,864,247 1/1999 Hirano et al. ........................... 327/143

*Primary Examiner*—My-Trang Nuton
*Attorney, Agent, or Firm*—Foley & Lardner

[57] ABSTRACT

A power on reset circuit includes a charge and discharge circuit for performing charge or discharge operation on the basis of a potential obtained by dividing a power supply voltage using a potential divider circuit. The potential thus outputted is held by a first latch circuit to output a reset on signal or a reset off signal. The output state of the charge and discharge circuit is inverted to the power supply voltage on the basis of the output potential of the first latch circuit using a second latch circuit, which comprises the minimum number of elements including a NAND gate, an inverter and two capacitors. Thus, the power on reset circuit can obtain a stable reset signal if the initial state of the reset signal output is in either the power supply voltage level or the ground level.

11 Claims, 5 Drawing Sheets

POWER ON RESET CIRCUIT

BACKGROUND OF THE INVENTION

1. Field of the Invention

The present invention relates to a power on reset circuit for producing a reset signal for initializing an integrated circuit when a power supply is turned on.

2. Related Background Art

Integrated circuits, such as electronic calculators and clocks, must be initialized when a power supply is turned on. In order to detect the turning ON of the power supply to produce pulses to set the state of an integrated circuit to be a predetermined state, a power on reset circuit is used.

FIG. 5 is a circuit diagram of a conventional power on reset circuit of this type. In this diagram, the source of a P-channel FET P1 is connected to a power supply voltage Vcc terminal. To the drain of the P-channel FET P1, one end of a circuit of serially-connected resistors R1 and R2 for dividing a potential is connected. The other end of the serially-connected circuit is connected to an ground terminal. The gate of an N-channel FET N1 is connected to the mutual connection of the resistors R1 and R2, i.e., to a node A. The source of the N-channel FET N1 is connected to the ground terminal. The source of a P-channel FET P2 is connected to the power supply voltage Vcc terminal. To the drain of the P-channel FET P2, the drain of an N-channel FET N2 is connected. The source of the N-channel FET N2 is connected to the ground terminal. The drain of the N-channel FET N1 is connected to the connection of the drains of the P-channel FET P2 and the N-channel FET N2, i.e., to a node B. The input terminal of an inverter INV1 is also connected to the node B. The output terminal of the inverter INV1 is connected to the gates of the P-channel FET P2 and the N-channel FET N2 as well as to the gate of the P-channel FET P1. From the output terminal of the inverter INV1, a reset signal R is outputted.

Also referring to FIGS. 6 and 7, the operation of this power on reset circuit will be described below.

In this power on reset circuit, it is presupposed that the reset signal R is in an ground point level, i.e., in a reset on state, in the initial state in which the power supply is turned on. When a power supply voltage Vcc rises with time, the P-channel FET P1 for receiving the reset signal R as a gate input is changed to an ON state to allow a through current I1 to flow through the circuit of serially-connected resistors R1 and R2. Therefore, the level of the node A, the potential of which is determined by the ratio of the resistors R1 and R2, also gradually rises in accordance with the rise of the power supply voltage Vcc. When the potential reaches a predetermined value, the N-channel FET N1 is changed to an ON state. When the N-channel FET N1 is changed to the ON state, a current I2 is allowed to flow through the P-channel FET P2 for holding the level of the reset signal R.

When the power supply voltage Vcc further rises so that the driving force of the N-channel FET N1 reaches a point exceeding the P-channel FET P2, i.e., a Vth in FIG. 6, the reset signal R is inverted to the level of the power supply voltage Vcc by means of the inverter INV1 which receives the potential of the node B, and the reset is canceled after time t1, so that the level is held by the N-channel FET N2.

In the conventional power on reset circuit shown in FIG. 5, there are some cases where the initial state of the reset signal R, in which the power supply is turned on, follows the rise of the power supply voltage Vcc under the influence of the parasitic capacity, which is parasitic on the respective elements, and under the influence of the residual electric charge as shown in FIG. 7. In this case, since the circuit is held in the stable state, no reset signal is outputted, so that the malfunction of the system occurs.

SUMMARY OF THE INVENTION

It is therefore an object of the present invention to eliminate the aforementioned problems and to provide a power on reset circuit which can obtain a stable reset signal if the initial state of the output of the reset signal is in either a power supply voltage level or an ground level.

In order to accomplish the aforementioned and other objects, according to one aspect of the present invention, a power on reset circuit comprises: a reset signal generator circuit (1, 3, 4, 5) for performing any one of a first operation and a second operation just after a power supply is turned on, the reset signal generator circuit (1, 3, 4, 5) causing an output terminal (7) to output a substantially level constant signal till a reset off time (t1) when the first operation is performed, and continuously output a level change signal following a rise of the power supply voltage without outputting the level constant signal when the second operation is performed; and a forced reset circuit (6, 2), which is arranged between the output terminal (7) and a node (12) arranged in the reset signal generator circuit (1, 3, 4, 5) and which functions as a feedback circuit, the forced reset circuit (6, 2) being prevented from feed back-operating substantially when the reset signal generator circuit (1, 3, 4, 5) performs the first operation, while the forced reset circuit (6, 2) receiving the level change signal as a feedback signal when said reset signal generator circuit (1, 3, 4, 5) performs the second operation, and supplying a forced reset signal to the reset signal generator circuit (1, 3, 4, 5) to cause the reset signal generator circuit (1, 3, 4, 5) to output the level constant signal when the level change signal reaches a forced reset potential (Vtho) at a forced reset time (t0) earlier than the reset off time (t1).

The forced reset circuit (6, 2) may comprise: a latch circuit (6) for receiving the level change signal to latch and output a control signal at the forced reset time (t0); and a switch circuit (2) for receiving the control signal at the forced reset time (t0) to output and supply the power supply voltage as the forced reset signal to the node (12) arranged in the reset signal generator circuit (1, 3, 4, 5).

The latch circuit (6) may comprise a NAND circuit (6*a*), a feedback inverter (6*b*) and at least one node setting coupling capacitor (CP1, CN1). In this case, the output terminal (7) may be connected to one of input terminals of the NAND circuit (6*a*), and an output terminal of the inverter (6*b*) may be connected to the other input terminal of the NAND circuit (6*a*). In addition, an output terminal of the NAND circuit (6*a*) may serve as an output terminal (C) for outputting the control signal, and the coupling capacitor (CN1, CP1) may be connected to at least one of the output terminal (C) and the other input terminal of the NAND circuit (6*b*).

The coupling capacitor (CN1, CP1) may be connected to each of the output terminal (C) and the other input terminal of the NAND circuit (6*b*), respectively.

The output terminal (C) of the NAND circuit (6*b*) may be connected to a control terminal of the switch circuit (2), and both terminals of the switch circuit (2) may be connected to a power supply voltage terminal, to which said power supply voltage is applied when the power supply is turned on, and to the node (12) arranged in the reset signal generator circuit (5).

The coupling capacitor (CP1, CN1) may comprise a gate capacitor of FET.

The reset signal generator circuit (1, 3, 4, 5) may comprise: a series circuit of a first switch circuit (P1) and a voltage drop circuit (3), the series circuit being connected to a high-voltage side source terminal and a low-voltage side source terminal;

a charge and discharge switch (4), a control terminal of which is connected to an output side of the voltage drop circuit (3), one end of which is connected to the low-voltage side power supply terminal, and the other end of which is connected to said node, the charge and discharge switch (4) being turned on when the output from said voltage drop circuit (3) reaches a reset off potential (Vth) at the reset off time (t1) in response to the turning ON of the power supply; and a latch circuit arranged between the node and the output terminal (7), the level constant signal being outputted to the output terminal (7) when the forced reset signal is supplied at the forced reset time (t0) thereto, and an inverted level of the node being outputted to the output terminal (7) to cancel a reset on state when the charge and discharge switch (N1) is turned on at the reset off time (t1) to decrease a level of the node (12).

The voltage drop circuit (3) may comprise a plurality of serially-connected resistors, and an output may be obtained from an intermediate point between two resistors of the plurality of serially-connected resistors.

Each of the plurality of serially-connected resistors, a MOSFET, the gate of which is connected to the source/drain thereof.

According to a further aspect of the present invention, a power on reset circuit comprises: a first switch circuit (1) arranged between a power supply voltage (Vcc) terminal and a first node (11);

a second switch circuit (2) arranged between the power supply voltage (Vcc) terminal and a second node (12);

a potential dividing circuit (3), arranged between the first node (11) and an ground terminal, for outputting a potential obtained by dividing a potential of the first node (11);

a charge and discharge circuit (4), arranged between the second node (12) and the ground terminal, for charging or discharging the second node (12) in accordance with an output potential of the potential dividing circuit (3); and a latch circuit (5) for holding a potential of the second node (12) to output a signal from an output terminal (7) to the first switch circuit (1) to control a switching operation of the first switch circuit (1), wherein an input side of the latch circuit (5) is electrically connected to the power supply voltage (Vcc) terminal when an output side potential of the latch circuit (5) follows a rise of the power supply voltage (Vcc) in an initial state in which the power supply is turned on.

The latch circuit (5) may output a reset on signal from the output terminal (7) by electrically connecting the input side (12) of the latch circuit to the power supply voltage (Vcc) terminal.

The input side (12) of the latch circuit (5) may be electrically disconnected from the power supply voltage (Vcc) terminal when the latch circuit (5) outputs the reset on signal from the output terminal (7).

The latch circuit (5) may output a reset off signal from the output terminal (7) when the charge and discharge circuit (4) starts to discharge the second node (12).

According to a still further aspect of the present invention, there is provided a power on reset circuit for producing a reset signal when a power supply is turned on, the power on reset circuit comprising: a first switch circuit (1) arranged between a power supply voltage (Vcc) terminal and a first node (11);

a second switch circuit (2) arranged between the power supply voltage (Vcc) terminal and a second node (12);

a potential dividing circuit (3), arranged between the first node (11) and an ground terminal, for outputting a potential obtained by dividing a potential of the first node (11);

a charge and discharge circuit (4), arranged between the second node (12) and the ground terminal, for charging or discharging said second node (12) in accordance with an output potential of the potential dividing circuit (3);

a first latch circuit (5) for holding a potential of the second node (12) to output a signal from an output terminal (7) to said first switch circuit (1) to control a switching operation of said first switch circuit (1); and a second latch circuit (6) for receiving an output signal of said first latch circuit (5) to control a switching operation of said second switch circuit (2), said second latch circuit (6) including: a NAND gate (6*a*) having a first input terminal connected to the output terminal (7) and an output terminal connected to a control terminal of the second switch circuit (2); an inverter (6*b*) having an input terminal connected to the output terminal of the NAND gate (6*a*) and an output terminal connected to a second input terminal of said NAND gate (6*a*); a first capacitor (CP1) connected between the power supply voltage (Vcc) terminal and the second input terminal of said NAND gate (6*a*); and a second capacitor (CN1) connected between the output terminal of said NAND gate (6*a*) and the ground terminal.

If the second switch circuit (2) is turned off, the charge and discharge circuit (4) may charge the second node (12) when the output of the potential dividing circuit (3) is lower than or equal to a first predetermined potential and discharge the second node (12) when the output of the potential dividing circuit (3) exceeds the first predetermined potential. In this case, the second latch means 6 may latch and output a control signal when the output signal of the first latch circuit (5) exceeds a second predetermined potential, and the second switch circuit (2) may be turned on by the control signal outputted from the second latch circuit (6).

An absolute value of the second predetermined potential may be less than an absolute value of said power supply voltage, at which said charge and discharge means (4) starts to discharge.

The first latch circuit (5) may cause the output terminal (7) to output a reset on signal when the second switch circuit (2) is turned on by the control signal outputted from the second switch circuit (6).

The first latch circuit (5) may cause the output terminal (7) to output a reset off signal when the charge and discharge circuit (4) starts to discharge the second node (12).

The first switch circuit (1) may be arranged between the power supply voltage (Vcc) terminal and the first node (11), and have a first P-channel transistor (P1) having a gate, to which the signal outputted from the first latch circuit (5) is applied. The potential dividing circuit (3) may have a plurality of serially-connected resistors R1, R2 arranged between the first node (11) and the ground terminal, and output a divided potential from a connection (A) of the resistors. The charge and discharge means may be arranged between the second node (12) and the ground terminal, and have a first N-channel transistor (N1) having a gate, to which the output potential of the potential dividing circuit (3) is applied. The first latch circuit (5) may have a first inverter (INV1) which has an input terminal connected to the second node (12) and an output terminal connected to the output terminal (7), and a second inverter (P2, N2) which has an input terminal connected to the output terminal (7) and an output terminal connected to the second node (12). The second switch circuit (2) may be arranged between the power supply voltage (Vcc) terminal and the second node (12), and have a second P-channel transistor (P7) having a gate, to which the control signal outputted from the second latch circuit is applied.

The first capacitor (CP1) is a third P channel FET, the source and the drain of said third P channel FET being connected to power supply voltage (Vcc) terminal and the gate of the third P channel FET being connected to the second input terminal of the NAND gate, and the second capacitor (CN1) is a second N channel FET, the source and the drain of the second N channel FET being connected to the ground terminal and the gate of the second N channel FET being connected to the output termian of the NAND gate.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENT

Referring now to the accompanying drawings, the preferred embodiment of a power on reset circuit according to the present invention will be described in detail below.

Figure 1:
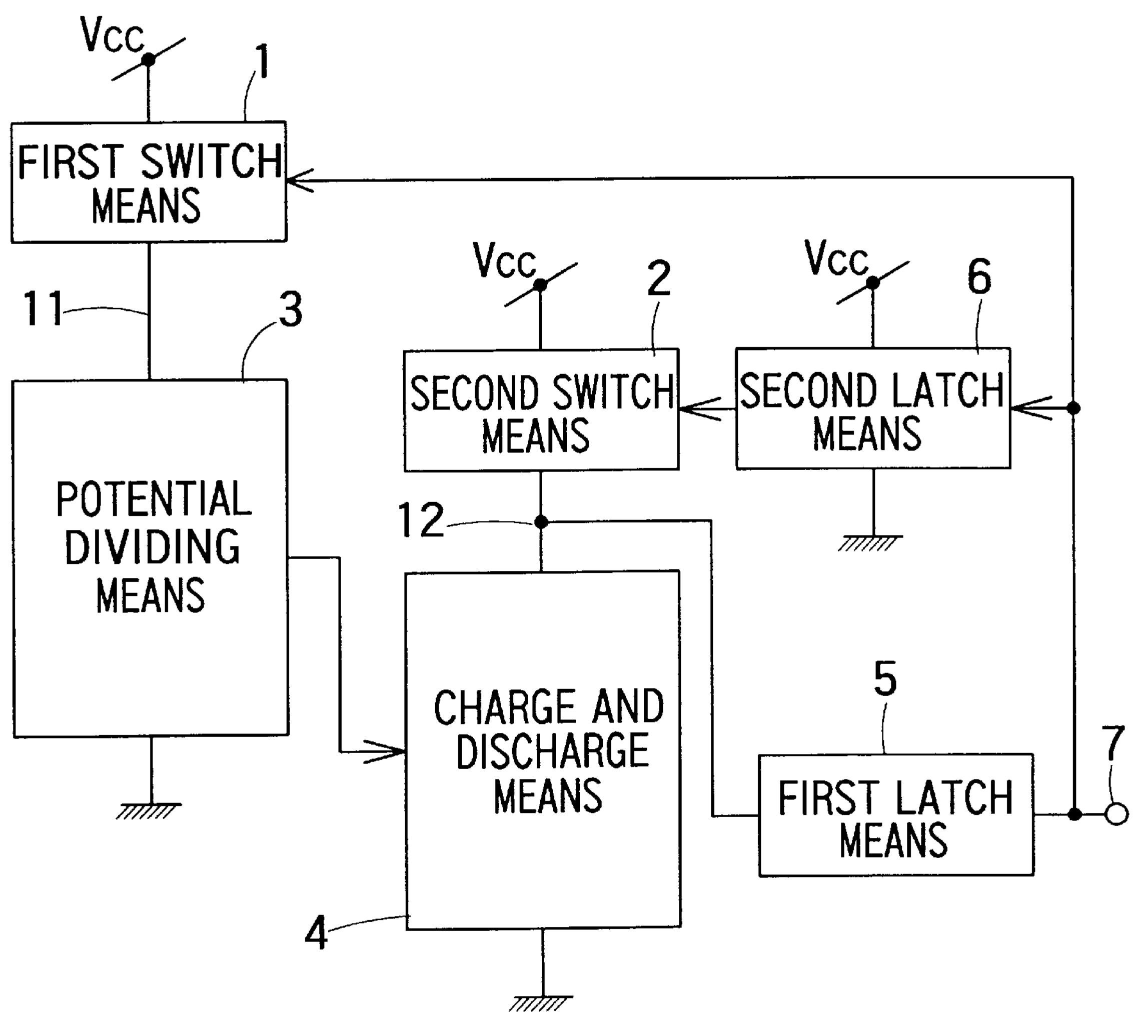
FIG. 1 is a block diagram schematically illustrating the preferred embodiment of a power on reset circuit according to the present invention.

FIG. 1 is a block diagram schematically illustrating the preferred embodiment of a power on reset circuit according to the present invention. In this diagram, a first switch means 1 is arranged between a power supply voltage Vcc terminal and a first node 11. The control terminal of the first switch means 1 is connected to an output terminal 7 so that the first switch means 1 is switched to an ON state when a difference between the level of an output signal applied to the output terminal 7 and a power supply voltage Vcc is higher than or equal to a predetermined value. Between the first node 11 and an ground terminal, a potential dividing means 3, which comprises a plurality of serially-connected resistors for dividing the potential of the first node 11 to output a divided potential from the mutual connection of the resistors, is connected.

A second switch means 2 is arranged between the power supply voltage Vcc terminal and a second node 12. The control terminal of the second switch means 2 is connected to an output terminal of a second latch means 6, which will be described later, so that the second switch means 2 is switched to an ON state when a difference between the level of the output terminal of the second latch means and the power supply voltage Vcc is higher than or equal to a predetermined value. Between the second node 12 and the ground terminal, a charge and discharge means 4 for applying a divided potential outputted from the potential dividing means 3 to the control terminal. The charge and discharge means 4 is held to an OFF state to cause the second node 12 to be in a charge state before the divided potential reaches a predetermined value, and switched to an ON state to discharge the second node 12 when the divided potential reaches the predetermined value.

Between the second node 12 and the output terminal 7, a first latch means 5 is connected. The first latch means 5 holds the state of the second node 12 when the potential of the second node 12 reaches a predetermined level. The first latch means 5 may comprise a circuit of inverse-parallel-connected inverters. The second latch means 6 is arranged between the output terminal 7 and the control terminal of the second switch means 2. The second latch means 6 has a NAND gate. A signal applied to the output terminal 7 is inputted to one of input terminals of the NAND gate, and a voltage varying in accordance with the power supply voltage is inputted to the other input terminal of the NAND gate. When these voltages reach a lower level than the power supply voltage Vcc, at which the charge and discharge means 4 starts to discharge, by a certain value, the second latch means 6 outputs a signal inverted from an input signal level, to switch the second switch means 2 to the ON state.

With this construction, the operation of the preferred embodiment of a power on reset circuit according to the present invention will be described below.

Figure 6:
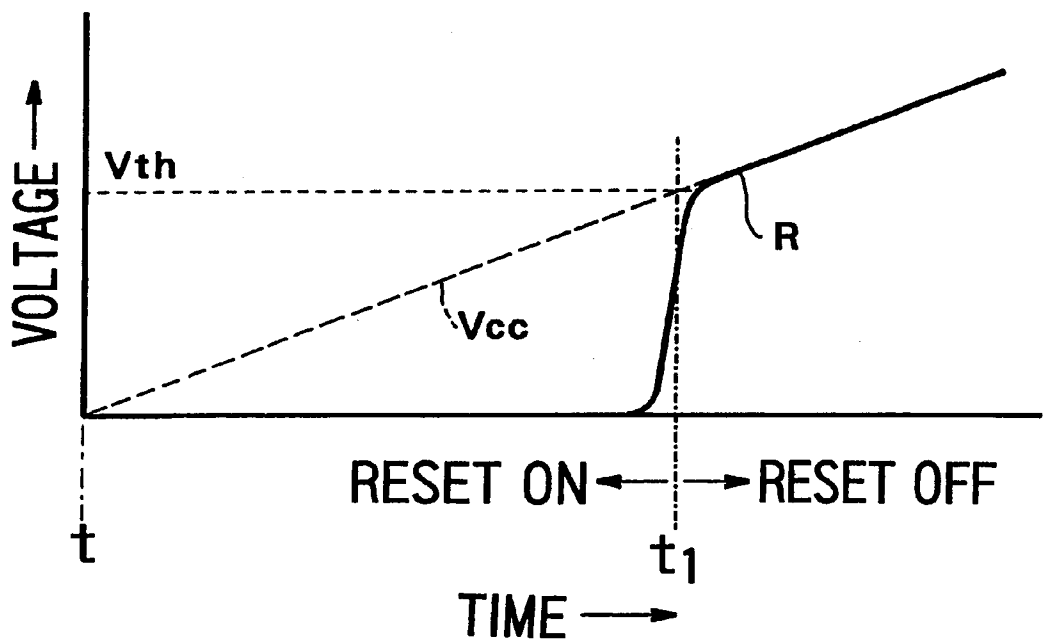
FIG. 6 is a graph showing the relationships between a power supply voltage, a reset signal and time for explaining the operation of the power on reset circuit of FIG. 5.
Figure 7:
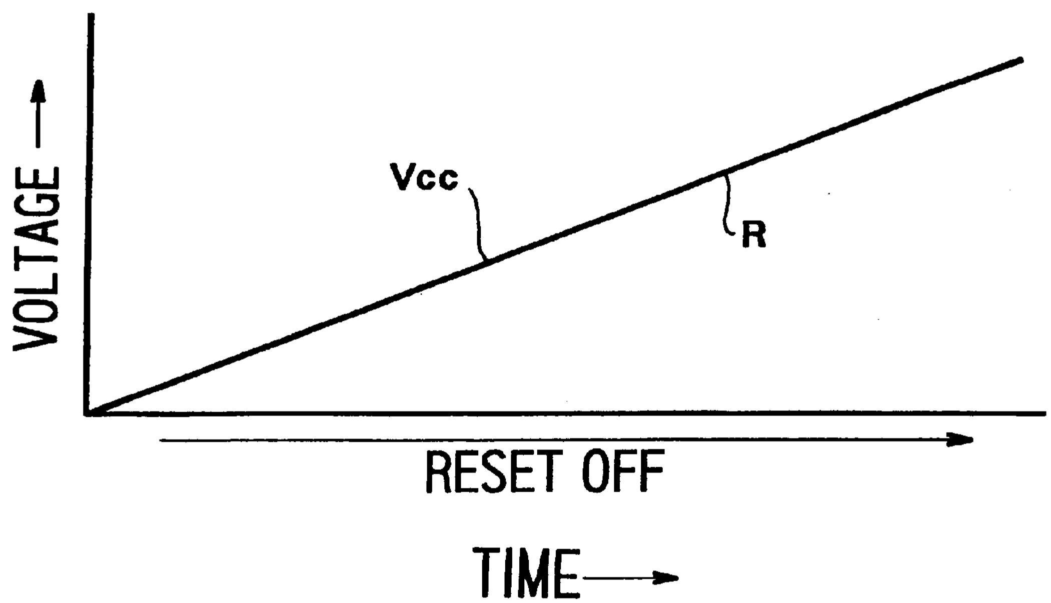
FIG. 7 is a graph showing the relationships between a power supply voltage, a reset signal and time for explaining the operation of the power on reset circuit of FIG. 5.

First, it is assumed that the output signal level of the output terminal 7 is equal to the level of the ground point in the initial state in which a power supply is turned on. When the power supply voltage Vcc rises to make a predetermined potential difference between the power supply voltage Vcc and the voltage of the output terminal, the first switch means 1 is switched to the ON state, so that the quantity of current flowing through the potential dividing means 3 increases and the divided potential also rises in accordance with the rise of the power supply voltage Vcc. When the divided potential reaches a predetermined level, the charge and discharge means 4 discharges the second node 12 so as to cause the level of the input terminal of the first latch means 5 to be equal to the ground potential. If the first latch means 5 comprises two inverse-parallel-connected inverters, the output signal level of the output terminal 7 is inverted to the level of the power supply voltage Vcc at that time, so that the reset is canceled in the same manner as that in FIG. 6.

Then, it is assumed that the output signal level of the output terminal 7 rises in accordance with the rise of the power supply voltage Vcc in the initial state in which the power supply is turned on. The second latch means 6 has the NAND gate which uses, as an input of logic "H", a signal of lower level than the power supply voltage Vcc, which causes the charge and discharge means 4 to start to discharge, by a certain value. Therefore, when the output signal level of the output terminal 7 increases to reach the lower level than the power supply voltage Vcc, at which the charge and discharge means 4 starts to discharge, by the certain value, the second latch means 6 latches the voltage to switch the second switch means 2 to be the ON state. At this time, since the charge and discharge means 4 is in the OFF state, the level of the second node 12 increases to hold the output signal of the first latch means 5, i.e., the output signal applied to the output terminal, at the ground level to switch the circuit to a reset on state. At this time or thereafter, the first switch means 1 is changed to the ON state in accordance with the rise of the power supply voltage Vcc. Then, the charge and discharge means 4 discharges the second node 12 by the rise of the divided potential of the potential dividing means 3, so that the level of the first latch means 5 is inverted to the level of the power supply voltage Vcc to cancel the reset in the same manner as that in FIG. 6.

Figure 2:
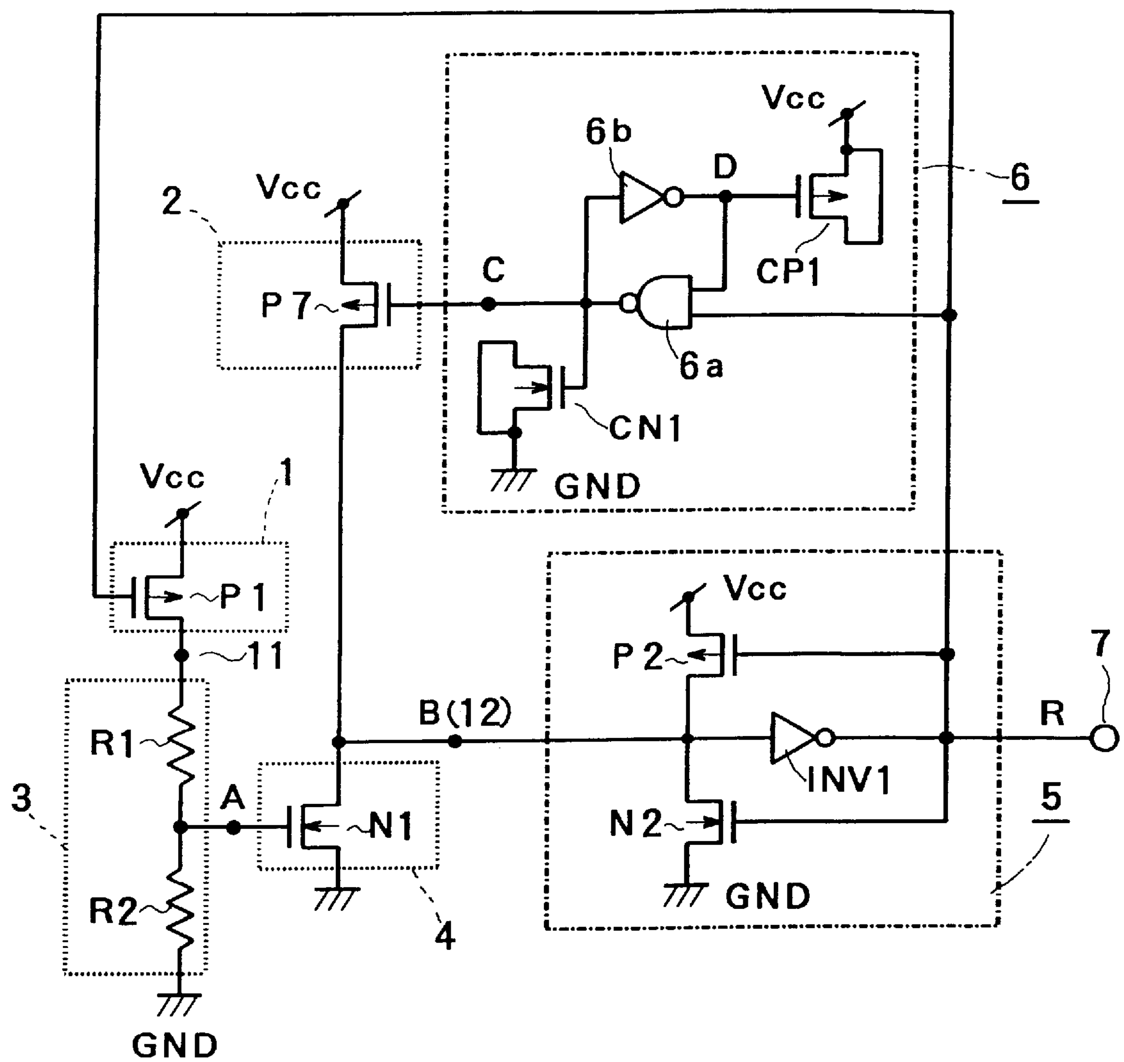
FIG. 2 is a circuit diagram illustrating the detailed construction of the preferred embodiment shown in FIG. 1.

FIG. 2 is a circuit diagram illustrating the detailed construction of the preferred embodiment of a power on reset circuit according to the present invention. As shown in FIG. 2, the source of a P-channel FET P1 is connected to the power supply voltage Vcc terminal. The drain of the P-channel FET P1 is connected to one end of a resistor R1, the other end of which is connected to one end of another resistor R2. The other end of the resistor R2 is connected to the ground terminal. The gate of an N-channel FET N1 is connected to the mutual connection of the resistors R1 and R2, i.e., a node A. The source of the N-channel FET N1 is connected to the ground terminal.

The source of a P-channel FET P7 is connected to the power supply voltage Vcc terminal, and the drain of the P-channel FET P7 is connected to the drain of the N-channel FET N1. The connection of the P-channel FET P7 and the N-channel FET N1 is a node B. The source of a P-channel FET P2 is connected to the power supply voltage Vcc terminal, and the source of an N-channel FET N2 is connected to the ground terminal. The drains of the P-channel FET P2 and the N-channel FET N2 are connected to each other as well as to the node B. The gates of the P-channel FET P2 and the N-channel FET N2 are connected to each other to form an output terminal for a reset signal R, and also connected to the gate of the P-channel FET P1. The input terminal of an inverter INV1 is connected to the node B, and the output terminal of the inverter INV1 is connected to the output terminal for the reset signal R. The P-channel FET P2 and the N-channel FET N2 are associated with each other to form a well-known inverter to be inverse-parallel-connected to the inverter INV1 to form the first latch means 5.

The output terminal for the reset signal R is connected to one of input terminals of a NAND gate 6*a*, the output terminal of which is connected to the gate of the P-channel FET P7. The output terminal of the NAND gate 6*a* is also connected to the input terminal of an inverter 6*b*, the output terminal of which is connected to the other input terminal of the NAND gate 6*a* as a node D. A P-channel FET CP1 is provided so as to function as a capacitor. That is, the source and drain of the P-channel FET CP1 are connected to each other as well as to the power supply voltage Vcc terminal, and the gate of the P-channel FET CP1 is connected to the second input terminal of the NAND gate 6*a*. An N-channel FET CN1 is also provided so as to function as a capacitor. That is, the source and drain of the N-channel FET CN1 are connected to each other as well as to the ground terminal, and the gate of the N-channel FET CN1 is connected to the output terminal of the NAND gate 6*a*. The NAND gate 6*a*, the inverter 6*b*, the P-channel FET CP1 and the N-channel FET CN1 are associated with each other to form the second latch means 6.

Furthermore, the P-channel FET P1 corresponds to the first switch means 1, and the resistors R1 and R2 correspond to the potential dividing means 3. In addition, the P-channel FET P7 corresponds to the second switch means 2, and the N-channel FET N1 corresponds to the charge and discharge means 4.

Also referring to FIG. 3, the operation of the preferred embodiment of a power on reset circuit according to the present invention, which has the above construction, will be described below.

Figure 5:
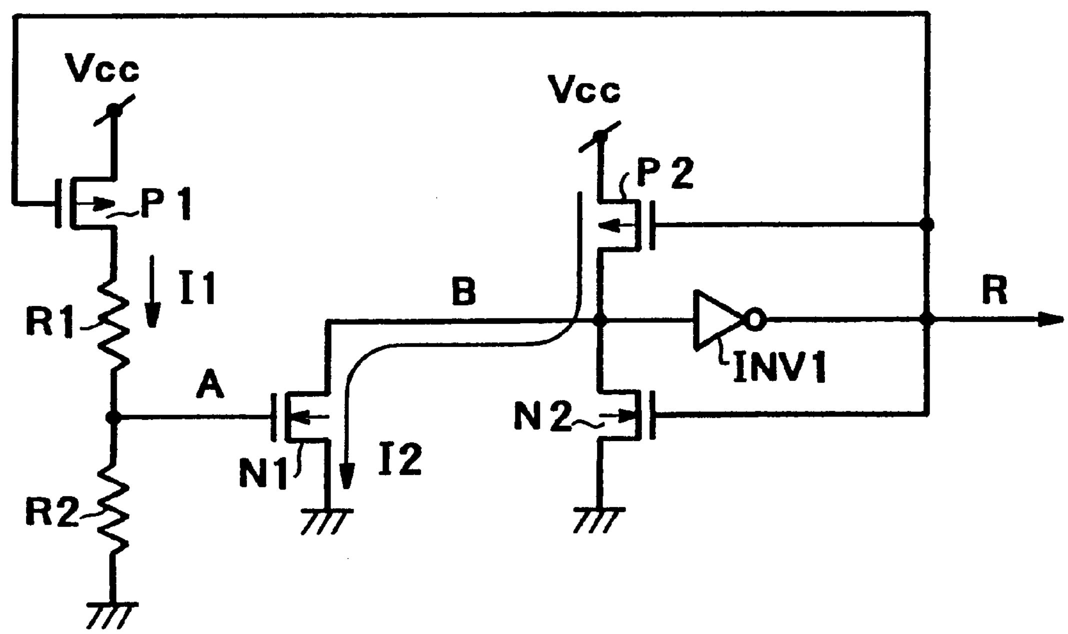
FIG. 5 is a circuit diagram of a conventional power on reset circuit.

First, when the initial state of the reset signal R, in which the power supply is turned on, is in the level of the ground point, the level of the one input terminal of the NAND gate 6*a* forming the second latch means 6 is "L". Therefore, the level of the output terminal of the NAND gate 6*a* is held to the power supply voltage Vcc until the power supply voltage Vcc reaches the Vth in FIG. 6, so that the P-channel FET P7 is held to be in the OFF state. That is, until the power supply voltage Vcc reaches the Vth in FIG. 6, the second latch means 6 and the P-channel FET P7 do not substantially function, so that the circuit functions as the same system as the conventional system of FIG. 5 to output a reset on signal in the same manner as that in FIG. 6.

Then, in a case where the initial state for the reset signal R, in which the power supply is turned on, follows the power supply voltage Vcc, the power supply voltage Vcc is applied directly to the first input terminal of the NAND gate 6*a* forming the second latch means 6. When the P-channel FET CP1 and the N-channel FET CN1, the gates of which are connected to the second input terminal and the output terminal of the NAND gate 6*a*, respectively, function as a coupling capacitor and when the power supply voltage Vcc applied to the one input terminal of the NAND gate 6*a* reaches a Vtho which is lower than the Vth, the circuit operates so that logic signals "H" are inputted to both input terminals of the NAND gate 6*a*. At this time, the level of the output terminal of the NAND gate 6*a* is changed to the level of the ground terminal. The inverter 6*b* holds the level of the second input terminal of the NAND gate 6*a* to be the power supply voltage Vcc.

Therefore, the level of the output terminal of the second latch means 6, i.e., the level of the node C, is changed to the ground level, so that the P-channel FET P7 is changed to the ON state. Thus, the potential of the drain of the N-channel FET N1 is raised to the power supply voltage Vcc, and the level of the reset signal R being the output of the first latch means 5 is rapidly decreased, so as to switch the circuit to the reset on state.

When the level of the reset signal reaches the level of the ground point, the level of the output terminal of the second latch means 6, i.e., the level of the node C, is held to the level of the power supply voltage Vcc to cause the P-channel FET P7 to be in the OFF state, so that there is no influence on the node B. Thereafter, the circuit operates similar to the conventional power on reset circuit shown in FIG. 5.

Referring to FIG. 2, the latch circuit 6 and the switch circuit 6 function as a forced reset circuit or feedback circuit.

Figure 3:
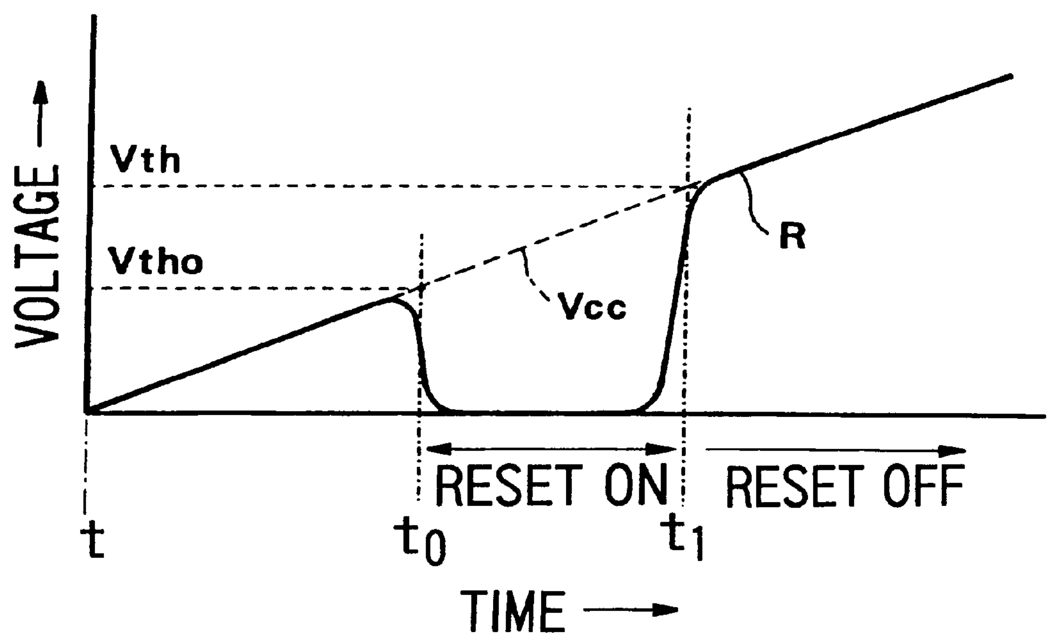
FIG. 3 is a graph showing the relationships between a power supply voltage, a reset signal and time for explaining the operation of the preferred embodiment shown in FIG. 2.

FIG. 3 shows the variation of the reset signal R in the preferred embodiment of a power on reset circuit according to the present invention. In a case where the initial state of the reset signal R, in which the power supply is turned on, follows the power supply voltage Vcc, when the voltage reaches the Vtho at time t0, the voltage is decreased to the level of the ground point. Then, when the power supply voltage reaches the vth at time t1, the voltage rises in accordance with the power supply voltage Vcc, so that a reset on signal is obtained between time t0 and time t1.

According to this preferred embodiment, it is possible to obtain a stable reset signal if the initial state of the output of the reset signal is in either the power supply voltage level or the ground level.

Figure 4:
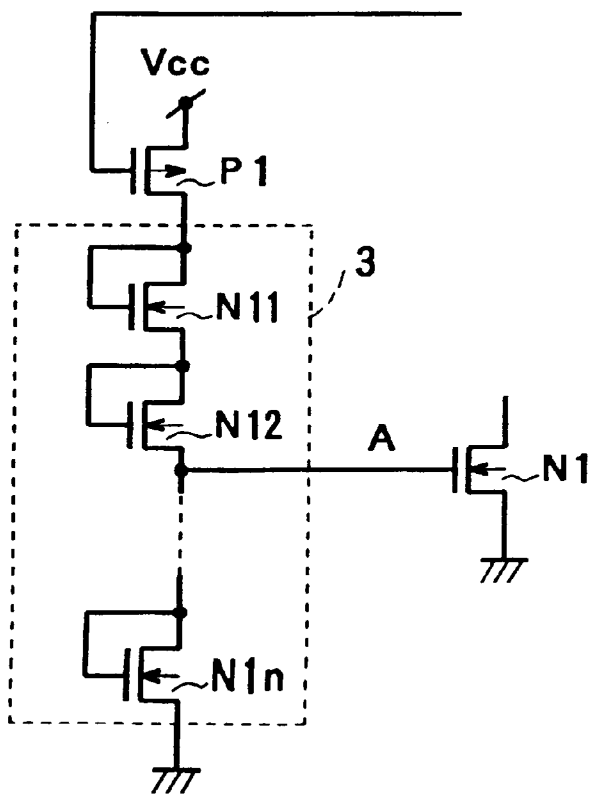
FIG. 4 is a circuit diagram of a modified embodiment of principal elements of the preferred embodiment shown in FIG. 1.

While the circuit of two serially-connected resistors has been used as the potential dividing means 3 in the above preferred embodiment, a plurality of N-channel MOSFET N11 through N1n, the gate of each of which is connected to the drain thereof, may be serially connected to each other to divide potential as shown in FIG. 4. Thus, it is possible to reduce the power consumption.

As can be clearly seen from the above description, according to the present invention, the charge and discharge means performs charge and discharge operations on the basis of the potential obtained by dividing the power supply voltage using the potential dividing means. The outputted potential is held by the first latch means to output a reset on or reset off signal, and the output state of the charge and discharge means is inverted to the power supply voltage on the basis of the output potential of the first latch means using the second latch means capable of being formed by the minimum number of elements comprising the NAND gate, the inverter and the two capacitors. Therefore, if the initial state of the reset signal output is in either the power supply voltage level or the ground level, a stable reset signal can be obtained.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A power on reset circuit comprising:

a first switch circuit arranged between a power supply voltage terminal and a first node;

a second switch circuit arranged between the power supply voltage terminal and a second node;

a potential dividing circuit, arranged between said first node and a ground terminal, for outputting a potential obtained by dividing a potential of said first node;

a charge and discharge circuit, arranged between said second node and the ground terminal, for charging or discharging said second node in accordance with an output potential of said potential dividing circuit;

a first latch circuit for holding a potential of said second node to output a signal from an output terminal to said first switch circuit to control a switching operation of said first switch circuit; and a second latch circuit for receiving an output signal of said first latch circuit to control a switching operation of said second switch circuit, wherein an input side of said first latch circuit is electrically connected to the power supply voltage terminal when an output side potential of said first latch circuit follows a rise of said power supply voltage in an initial state in which the power supply is turned on.

2. A power on reset circuit as set forth in claim 1, wherein said first latch circuit outputs a reset on signal from said output terminal by electrically connecting said input side of said first latch circuit to said power supply voltage terminal.

3. A power on reset circuit as set forth in claim 2, wherein said input side of said first latch circuit is electrically disconnected from said power supply voltage terminal when said first latch circuit outputs said reset on signal from said output terminal.

4. A power on reset circuit as set forth in claim 2, wherein said first latch circuit outputs a reset off signal from said output terminal when said charge and discharge circuit starts to discharge said second node.

5. A power on reset circuit for producing a reset signal when a power supply is turned on, said power on reset circuit comprising:

a first switch circuit arranged between a power supply voltage terminal and a first node;

a second switch circuit arranged between the power supply voltage terminal and a second node;

a potential dividing circuit, arranged between said first node and an ground terminal, for outputting a potential obtained by dividing a potential of said first node;

a charge and discharge circuit, arranged between said second node and the ground terminal, for charging or discharging said second node in accordance with an output potential of said potential dividing circuit;

a first latch circuit for holding a potential of said second node to output a signal from an output terminal to said first switch circuit to control a switching operation of said first switch circuit; and a second latch circuit for receiving an output signal of said first latch circuit to control a switching operation of said second switch circuit, said second latch circuit including: a NAND gate having a first input terminal connected to said output terminal and an output terminal connected to a control terminal of said second switch circuit; an inverter having an input terminal connected to said output terminal of said NAND gate and an output terminal connected to a second input terminal of said NAND gate; a first coupling capacitor connected between the power supply voltage terminal and said second input terminal of said NAND gate; and a second coupling capacitor connected between said output terminal of said NAND gate and the ground terminal.

6. A power on reset circuit as set forth in claim 5, wherein if said second switch circuit is turned off, said charge and discharge circuit charges said second node when the output of said potential dividing circuit is lower than or equal to a first predetermined potential and discharges said second node when the output of said potential dividing circuit exceeds said first predetermined potential, and wherein said second latch circuit latches and outputs a control signal when the output signal of said first latch circuit exceeds a second predetermined potential, and said second switch circuit is turned on by said control signal outputted from said second latch circuit.

7. A power on reset circuit as set forth in claim 6, wherein an absolute value of said second predetermined potential is less than an absolute value of said power supply voltage, at which said charge and discharge circuit starts to discharge.

8. A power on reset circuit as set forth in claim 7, wherein said first latch circuit causes said output terminal to output a reset on signal when said second switch circuit is turned on by said control signal outputted from said second latch circuit.

9. A power on reset circuit as set forth in claim 7, wherein said first latch circuit causes said output terminal to output a reset off signal when said charge and discharge circuit starts to discharge said second node.

10. A power on reset circuit as set forth in claim 6, wherein:

said first switch circuit is arranged between said power supply voltage terminal and said first node, and has a first P-channel transistor having a gate, to which said signal outputted from said first latch circuit is applied;

said potential dividing circuit has a plurality of serially-connected resistors arranged between said first node and the ground terminal, and outputs a divided potential from a connection of the resistors;

said charge and discharge circuit is arranged between said second node and the ground terminal, and has a first N-channel transistor having a gate, to which the output potential of said potential dividing circuit is applied;

said first latch circuit has a first inverter which has an input terminal connected to said second node and an output terminal connected to said output terminal, and a second inverter which has an input terminal connected to said output terminal and an output terminal connected to said second node; and said second switch circuit is arranged between the power supply voltage terminal and said second node, and has a second P-channel transistor having a gate, to which said control signal outputted from said second latch circuit is applied.

11. A power on reset circuit as set forth in claim 10, wherein said first coupling capacitor is a third P channel FET, the source and the drain of said third P channel FET being connected to the power supply voltage terminal and the gate of said third P channel FET being connected to the second input terminal of said NAND gate, and said second coupling capacitor is a second N channel FET, the source and the drain of said second N channel FET being connected to the ground terminal and the gate of said second N channel FET being connected to the output terminal of said NAND gate.

* * * * *